United States Patent
DeFranco et al.

(10) Patent No.: US 10,580,987 B2
(45) Date of Patent: Mar. 3, 2020

(54) PHOTOLITHOGRAPHIC PATTERNING OF ORGANIC ELECTRONIC DEVICES

(71) Applicant: ORTHOGONAL, INC., Rochester, NY (US)

(72) Inventors: John Andrew DeFranco, Rochester, NY (US); Terrence Robert O'Toole, Webster, NY (US)

(73) Assignee: Orthogonal, Inc., Rochester, NY (US)

( * ) Notice: Subject to any disclaimer, the term of this patent is extended or adjusted under 35 U.S.C. 154(b) by 270 days.

(21) Appl. No.: 15/501,109

(22) PCT Filed: Jul. 31, 2015

(86) PCT No.: PCT/US2015/043175
§ 371 (c)(1),
(2) Date: Feb. 1, 2017

(87) PCT Pub. No.: WO2016/019277
PCT Pub. Date: Feb. 4, 2016

(65) Prior Publication Data
US 2017/0222147 A1 Aug. 3, 2017

Related U.S. Application Data

(60) Provisional application No. 62/031,891, filed on Aug. 1, 2014.

(51) Int. Cl.
| | |
|---|---|
| *H01L 51/54* | (2006.01) |
| *H01L 51/52* | (2006.01) |
| *H01L 51/56* | (2006.01) |
| *H01L 51/00* | (2006.01) |
| *G03F 7/32* | (2006.01) |
| *H01L 51/50* | (2006.01) |
| *G03F 7/40* | (2006.01) |
| *G03F 7/004* | (2006.01) |
| *G03F 7/30* | (2006.01) |
| *G03F 7/42* | (2006.01) |

(52) U.S. Cl.
CPC ........ *H01L 51/0016* (2013.01); *G03F 7/0046* (2013.01); *G03F 7/3021* (2013.01); *G03F 7/322* (2013.01); *G03F 7/325* (2013.01); *G03F 7/40* (2013.01); *G03F 7/426* (2013.01); *H01L 51/0018* (2013.01); *H01L 51/508* (2013.01); *H01L 51/5012* (2013.01); *H01L 51/5056* (2013.01); *H01L 51/5064* (2013.01); *H01L 51/5072* (2013.01); *H01L 51/5096* (2013.01); *H01L 51/5203* (2013.01); *H01L 51/56* (2013.01)

(58) Field of Classification Search
CPC ........ G03F 7/3021; G03F 7/322; G03F 7/325; G03F 7/0046; G03F 7/40; G03F 7/426; H01L 51/0032; H01L 51/0018; H01L 51/0016; H01L 51/50; H01L 51/5012; H01L 51/5016; H01L 51/5056; H01L 51/5064; H01L 51/508; H01L 51/5096; H01L 51/5072; H01L 51/56; H01L 51/5203
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

| | | | |
|---|---|---|---|
| 4,720,432 A | 1/1988 | VanSlyke et al. | |
| 5,776,623 A | 7/1998 | Hung et al. | |
| 6,013,538 A | 1/2000 | Burrows et al. | |
| 6,208,075 B1 | 3/2001 | Hung et al. | |
| 6,720,573 B2 | 4/2004 | Son et al. | |
| 7,684,868 B2 | 3/2010 | Tai et al. | |
| 7,830,080 B2 * | 11/2010 | Tanada ................. | G09G 3/3258 313/500 |
| 7,955,719 B2 | 6/2011 | Hatwar et al. | |
| 8,106,582 B2 | 1/2012 | Yamamichi et al. | |
| 8,587,003 B2 | 11/2013 | Ando | |
| 8,846,301 B2 | 9/2014 | Ober et al. | |
| 9,034,736 B2 | 5/2015 | Sirringhaus et al. | |
| 9,054,341 B2 | 6/2015 | Kim et al. | |

(Continued)

FOREIGN PATENT DOCUMENTS

| | | |
|---|---|---|
| EP | 0 924 245 | 6/1999 |
| EP | 2 784 839 A1 | 10/2014 |

(Continued)

OTHER PUBLICATIONS

International Search Report for corresponding International Patent Application No. PCT/US2015/043175 dated Nov. 13, 2015, 2 pgs.

(Continued)

*Primary Examiner* — Andrew K Bohaty
(74) *Attorney, Agent, or Firm* — Merchant & Gould P.C.

(57) ABSTRACT

A method of patterning an organic device includes depositing a first organic functional layer over a device substrate to form a first intermediate structure, the first organic functional layer having a first function such as hole transport or electron transport. The first intermediate structure is coated with a fluoropolymer and treated in a processing agent comprising a fluorinated solvent in which the fluoropolymer is soluble to form a processed intermediate structure. A second organic functional layer is deposited over at least a portion of the first organic functional layer, the second organic functional layer also having the first function.

10 Claims, 7 Drawing Sheets

(56) References Cited

U.S. PATENT DOCUMENTS

| | | | |
|---|---|---|---|
| 9,091,913 | B2 | 7/2015 | Katz et al. |
| 9,104,104 | B2 | 8/2015 | Wright et al. |
| 9,298,088 | B2 | 3/2016 | Robello et al. |
| 9,500,948 | B2 | 11/2016 | Wright et al. |
| 9,541,829 | B2 | 1/2017 | Robello et al. |
| 9,806,099 | B2 | 10/2017 | Yamazaki et al. |
| 9,899,636 | B2 | 2/2018 | DeFranco et al. |
| 9,941,309 | B2 | 4/2018 | Yamazaki et al. |
| 2004/0211956 | A1* | 10/2004 | Kanno ............... H01L 51/5088 257/40 |
| 2005/0153058 | A1 | 7/2005 | Tachikawa et al. |
| 2008/0124824 | A1 | 5/2008 | Tsai et al. |
| 2010/0193778 | A1 | 8/2010 | An et al. |
| 2010/0289019 | A1 | 11/2010 | Katz et al. |
| 2011/0101317 | A1 | 5/2011 | Gregory et al. |
| 2011/0159252 | A1 | 6/2011 | Ober et al. |
| 2011/0309389 | A1 | 12/2011 | Yu et al. |
| 2012/0252149 | A1 | 10/2012 | Hiroki et al. |
| 2012/0305897 | A1 | 12/2012 | Ober et al. |
| 2013/0075768 | A1 | 3/2013 | Kim et al. |
| 2013/0084664 | A1 | 4/2013 | Yoshitoku et al. |
| 2013/0126833 | A1 | 5/2013 | Endo et al. |
| 2013/0137205 | A1 | 5/2013 | Moriyama et al. |
| 2013/0236999 | A1* | 9/2013 | Lee ....................... G03F 7/0046 438/35 |
| 2014/0127625 | A1 | 5/2014 | Defranco et al. |
| 2014/0154827 | A1 | 6/2014 | Lee et al. |
| 2014/0197378 | A1 | 7/2014 | Lecloux et al. |
| 2014/0197379 | A1 | 7/2014 | Li |
| 2014/0319499 | A1 | 10/2014 | Yamazaki et al. |
| 2014/0322656 | A1 | 10/2014 | Wright et al. |
| 2014/0356789 | A1 | 12/2014 | Wright et al. |
| 2015/0000976 | A1 | 1/2015 | Frohler et al. |
| 2015/0132699 | A1 | 5/2015 | Robello et al. |
| 2015/0140729 | A1 | 5/2015 | Ferro et al. |
| 2016/0027763 | A1 | 1/2016 | Cope |
| 2016/0049518 | A1 | 2/2016 | Endo |
| 2016/0164040 | A1 | 6/2016 | Kurata et al. |
| 2017/0236849 | A1 | 8/2017 | Endo |

FOREIGN PATENT DOCUMENTS

| | | |
|---|---|---|
| WO | 02/04534 A1 | 1/2002 |
| WO | 2011/015808 A1 | 2/2011 |
| WO | 2011/139771 A2 | 11/2011 |
| WO | 2011/139774 A2 | 11/2011 |
| WO | 2012/118713 A2 | 9/2012 |
| WO | 2012/143817 A2 | 10/2012 |
| WO | 2012/148884 A2 | 11/2012 |
| WO | 2013/074622 A1 | 5/2013 |
| WO | 2014/053202 A1 | 4/2014 |
| WO | 2015/013396 A1 | 1/2015 |
| WO | 2015/028407 A1 | 3/2015 |
| WO | 2015/120025 A1 | 8/2015 |
| WO | 2016/019210 A1 | 2/2016 |
| WO | 2016/019212 A1 | 2/2016 |
| WO | 2016/019273 A1 | 2/2016 |

OTHER PUBLICATIONS

Krotkus, S. et al., "Influence of bilayer processing on p-i-n OLEDs: towards multicolor photolithographic structuring of organic displays", Proc. of SPIE, 9360: 93600W-1-93600W-10 (2015).

Krotkus, S. et al., "Photo-patterning of Highly Efficient State-of-the-Art Phosphorescent OLEDs Using Orthogonal Hydrofluoroethers", Adv. Optical Mater., 2(11): 1043-1048 (2014).

Yamamoto, H. et al., "Understanding Extrinsic Degradation in Phosphorescent OLEDs", SID 2014 Digest, 758-761 (2014).

LOR and PMGI Resists, MicroChem Data Sheet, 7 pages (2006).

Malinowski, P. et al., "True-Color 640 ppi OLED Arrays Patterned by CA i-line Photolithography", SID 2015 Digest, 215-218 (2015).

Sakanoue, T. et al., "Fluorosurfactant-assisted photolithography for patterning of perfluoropolymers and solution-processed organic semiconductors for printed displays", Applied Physics Express, 7: 101602-1-101602-4 (2014).

* cited by examiner

PHOTOLITHOGRAPHIC PATTERNING OF ORGANIC ELECTRONIC DEVICES

CROSS-REFERENCE TO RELATED APPLICATIONS

This application is a National Stage Application of PCT/US2015/043175 filed on Jul. 31, 2015, which claims the benefit of U.S. Provisional Application No. 62/031,891, filed on Aug. 1, 2014, and which applications are incorporated herein by reference. A claim of priority is made to each of the above disclosed applications. This application is also related to PCT International Applications with PCT/US2015/043168, PCT/US2015/043036 and PCT/US2015/043034, filed on Jul. 31, 2015 and claiming the benefit of U.S. Provisional Applications Nos. 62/031,888 (filed on Aug. 1, 2014), 62/031,897 (filed on Aug. 1, 2014) and 62/096,582 (filed on Dec. 24, 2014), and 62/031,903 (filed on Aug. 1, 2014), respectively.

BACKGROUND

1. Field of the Disclosure

The present disclosure relates to photolithographic patterning of organic, electronic and organic electronic devices. The disclosed methods and materials are particularly useful for patterning OLED devices.

2. Discussion of Related Art

Organic electronic devices may offer significant performance and price advantages relative to conventional inorganic-based devices. As such, there has been much commercial interest in the use of organic materials in electronic device fabrication. For example, displays based on organic light-emitting diode (OLED) technology have recently gained popularity and offer numerous advantages over many other display technologies. Although solution-deposited OLED materials have been developed, the highest-performing OLED devices typically use vapor-deposited thin films of active organic materials.

A key challenge for full-color OLED displays is patterning the array of red, green and blue pixels. For vapor-deposited OLEDs, a fine metal mask having openings corresponding to the fineness of the desired pattern is conventionally used. However, a vapor deposited film builds up on the mask which may eventually narrow the mask openings or cause deforming stresses on the mask. Therefore, it is necessary to clean the mask after a certain number of uses, which is disadvantageous from the viewpoint of manufacturing costs. In addition, when a fine metal mask is increased in size to accommodate larger substrates, the positional accuracy of the mask openings becomes much more difficult, both from the standpoint of initial alignment and then maintaining the alignment during deposition due to thermal expansion issues. Positional accuracy may be improved to a degree by enhancing the stiffness of a frame of the mask, but this increase the weight of the mask itself causes other handling difficulties. Similar resolution problems exist for devices using organic thin film transistor (OTFT) technology.

Thus, a need exists for cost-effective patterning of organic electronic devices such as OLED devices, and particularly those having critical pattern dimensions of less than about 100 μm.

SUMMARY

The authors have found that exposing a first organic layer to certain processing steps or conditions can sometimes degrade device performance, but have unexpectedly found that deposition of a second organic layer after such processing, wherein the second organic layer has the same function or has substantially the same chemical composition as the first organic layer, can reduce such degradation.

In accordance with the present disclosure, a method of patterning an organic device comprises: depositing a first organic functional layer over a device substrate to form a first intermediate structure, the first organic functional layer having a first function; processing the first intermediate structure to form a processed first intermediate structure, wherein the processing includes coating a fluoropolymer over the first intermediate structure and subsequent dissolution of the fluoropolymer in a processing agent comprising a fluorinated solvent; and depositing a second organic functional layer over at least a portion of the first organic functional layer, the second organic functional layer also having the first function.

In accordance with another aspect of the present disclosure, an organic device comprises: a first organic functional layer having a first function, a second organic functional layer also having the first function and provided over at least a portion of the first organic functional layer and fluorinated polymer disposed between the first and second organic functional layers, the fluorinated polymer forming a continuous or discontinuous film having a thickness of less than 2 nm. The organic device may be, for example, an OLED device.

DETAILED DESCRIPTION

Figure 1:
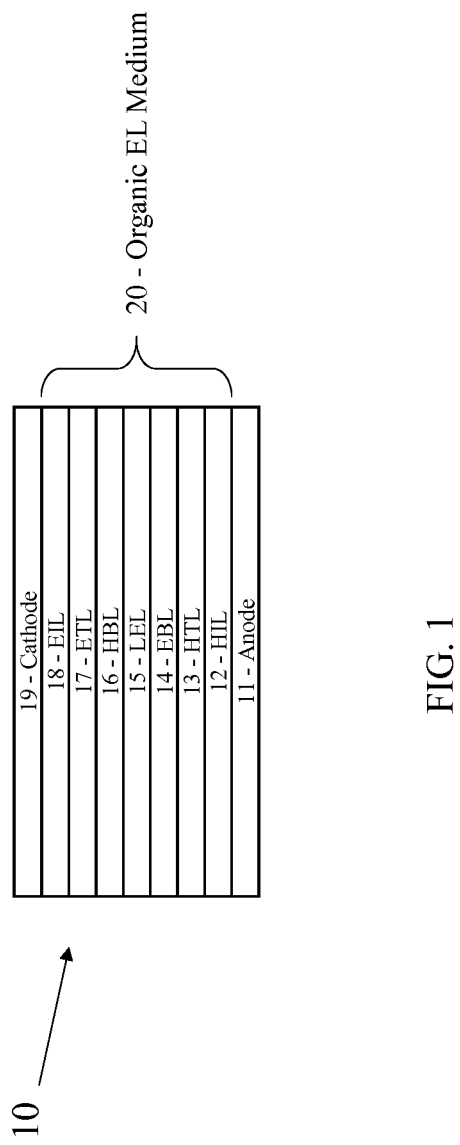
FIG. 1 is cross sectional view of a representative OLED device.

It is to be understood that the attached drawings are for purposes of illustrating the concepts of the disclosure and may not be to scale.

A feature of the present disclosure is the use of "orthogonal" photoresist structures and processing agents that are compatible with sensitive organic electronic devices and materials such as OLED devices and materials, i.e., they are chosen to have low interaction with sensitive device layers that are not intended to be dissolved or otherwise damaged. Conventional photoresist materials typically use harsh organic solvents and often strongly caustic developers that can easily damage one or more layers of an OLED device. Particularly useful orthogonal photoresist structures and processing agents include fluorinated polymers or molecular solids and fluorinated solvents. Some orthogonal photoresist structures and systems are disclosed in U.S. patent application Ser. Nos. 12/864,407, 12/994,353, 14/113,408, and 14/291,692, the contents of which are incorporated by reference. The photoresist structures of the present disclosure may optionally have an undercut profile, which can be advantageous in so-called "lift-off" photolithographic patterning. Such photoresist structures may also be referred to herein as lift-off structures. Undercut lift-off structures are preferred wherein a top portion is wider than a base portion adjacent to a substrate. The photoresist structure may be a single layer (e.g. an inverted trapezoid), a bilayer or multilayer structure. It is preferred that at least the layer or portion of the photoresist structure in contact with the sensitive organic electronic device is a fluorinated polymer or molecular solid provided, e.g., from a fluorinated coating solvent or by vapor deposition. Orthogonality can be tested by, for example, immersion of a device comprising the material layer of interest into a target composition prior to operation (e.g., into a coating solvent, a developing agent, a lift-off agent, or the like). The composition is orthogonal if there is no serious reduction in the functioning of the device.

Certain embodiments disclosed in the present disclosure are particularly suited to the patterning of solvent-sensitive, active organic materials. Examples of active organic materials include, but are not limited to, organic electronic materials, such as organic semiconductors, organic conductors, OLED (organic light-emitting diode) materials and organic photovoltaic materials, organic optical materials and biological materials (including bioelectronics materials). Many of these materials are easily damaged when contacted with organic or aqueous solutions used in conventional photolithographic processes. Active organic materials are often coated to form a layer that may be patterned. For some active organic materials, such coating can be done from a solution using conventional methods. Alternatively, some active organic materials are coated by vapor deposition, for example, by sublimation from a heated organic material source at reduced pressure. Solvent-sensitive, active organic materials can also include composites of organics and inorganics. For example, the composite may include inorganic semiconductor nanoparticles (quantum dots). Such nanoparticles may have organic ligands or be dispersed in an organic matrix. The present disclosure is particularly directed towards patterning of OLED devices, but the concepts and methods disclosed herein can be applied to other organic electronic or bioelectronic devices.

OLED Structures

Many different types of OLED device structures have been developed over the years. Essentially, an OLED device includes at a minimum an anode for injecting holes, a cathode for injecting electrons and an organic EL medium sandwiched between the electrodes wherein the holes and electrons combine to produce light emission. OLED devices are often provided on a substrate. The electrode adjacent to a substrate is typically referred to as the first or bottom electrode. The electrode spaced away from the substrate by the organic EL medium is typically referred to as the second or top electrode. A common structure ("standard structure") includes an anode as the bottom electrode provided on a substrate with subsequent organic layers deposited over the anode and finally a cathode deposited over the organic layers to form the top electrode. An "inverted structure" is just the reverse and has a cathode as the bottom electrode provided on a substrate with subsequent organic layers deposited over the cathode and finally an anode deposited over the organic layers to form a top electrode. A "bottom-emitting" OLED typically includes a transparent or translucent bottom electrode and a reflective or light absorbing top electrode structure. That is, light is directed through the device substrate. A "top-emitting" OLED includes a transparent or translucent top electrode and a reflective or light absorbing bottom electrode structure. That is, light is directed away from the device substrate. A "transparent" OLED has transparent or translucent top and bottom electrodes.

A non-limiting example of an OLED device 10 is shown in FIG. 1 and includes anode 11, hole-injecting layer (HIL) 12, hole-transporting layer (HTL) 13, electron-blocking layer (EBL) 14, light-emitting layer (LEL) 15 (sometimes referred to in the art as an emissive layer or EML), hole-blocking layer (HBL) 16, electron-transporting layer (ETL) 17, electron-injecting layer (EIL) 18 and cathode 19. The layers between the anode and cathode are often collectively referred to as the organic EL medium 20. There are many other OLED layer architectures known in the art having fewer or additional layers and there can be overlap in layer functionality. For example, if an EBL is used, it typically also has hole-transporting properties in addition to electron-blocking properties. An HBL, if used, typically has electron-transporting properties. The LEL might have predominantly hole-transporting or electron-transporting properties, or it might have both. There can be multiple light emitting layers. So-called "tandem" architecture is known that includes one or more charge separation layers between light-emitting stacks that can double current efficiency.

Some non-limiting examples of materials useful for OLED devices are discussed below. Although the emphasis is on organic EL medium materials that can be vapor deposited, certain embodiments of the present disclosure may instead use solution deposited OLED materials. A few non-limiting examples of OLED material and structures can be found in U.S. Pat. Nos. 8,106,582 and 7,955,719, the entire contents of which are incorporated by reference.

When EL emission is viewed through the anode, the anode should be substantially transparent to the emission of interest. The term "transparent" herein means that at least 30% of emitted light is transmitted, preferably at least 50%. Common transparent anode materials used in the present disclosure are indium-tin oxide (ITO), indium-zinc oxide (IZO), and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and many conductive materials can be used, regardless if transparent, opaque, or reflective. Example conductors for the present disclosure include, but are not limited to, gold, iridium, molybdenum, palladium, and platinum. Unless unique HIL materials are used, typical anode materials have a work function of at least 4.0 eV.

If EL emission is viewed through the cathode, it must be transparent or nearly transparent. For such applications, metals must be thin (preferably less than 25 nm) or one may use transparent conductive oxides (e.g. indium-tin oxide, indium-zinc oxide), or a combination of these materials. Some non-limiting examples of optically transparent cathodes have been described in more detail in U.S. Pat. No. 5,776,623. If EL emission is not viewed through the cathode, any conductive material known to be useful in OLED devices may be selected, including metals such as aluminum, molybdenum, gold, iridium, silver, magnesium, the above transparent conductive oxides, or combinations of these. Desirable materials promote electron injection at low voltage and have effective stability. Useful cathode materials often contain a low work function metal (<4.0 eV) or metal alloy. Cathode materials can be deposited, for example, by evaporation, sputtering, or chemical vapor deposition.

The HIL can be formed of a single material or a mixture of materials. The hole-injecting layer may be divided into several layers having different composition. The hole-injecting material can serve to improve the film formation property of subsequent organic layers and to facilitate injection of holes into the hole-transporting layer. Suitable materials for use in the hole-injecting layer include, but are not limited to porphyrin and phthalocyanine compounds as described in U.S. Pat. No. 4,720,432, thiophene-containing compounds, phosphazine compounds, and certain aromatic amine compounds. The HIL may include an inorganic compound such as a metal oxide (e.g., molybdenum oxide), metal nitride, metal carbide, a complex of a metal ion and organic ligands, and a complex of a transition metal ion and organic ligands. Suitable materials for use in the hole-injecting layer may include plasma-deposited fluorocarbon polymers (CFx) as described in U.S. Pat. No. 6,208,075, certain hexaazatriphenylene derivatives as described in U.S. Pat. No. 6,720,573 B2 (e.g. hexacyanohexaazatriphenylene) or tetracyanoquinone derivatives such as F4TCNQ. The hole-injecting layer can also be composed of two components: for example, an aromatic amine compound, doped with a strong oxidizing agent, such as dipyrazino[2,3-f:2',3'-h]quinoxalinehexacarbonitrile, F4TCNQ, or FeCl3.

The HTL can be formed of a single or a mixture of organic or inorganic materials and may be divided into several layers. The hole-transporting layer most commonly includes a tertiary aryl amine, e.g., a benzidine or a carbazole, but instead (or in addition) may comprise a thiophene, or other electron-rich material. EBL materials (if used) are generally selected from the same group as HTL materials and have an electron conduction band significantly higher in energy (more difficult to reduce) than the overlying LEL thereby creating a barrier to further electron transport.

The LEL commonly includes a host material and a light-emitting dopant. Injected holes and electrons recombine in the LEL. Hosts include HTL materials, ETL materials, a mixture of HTL and ETL materials or ambipolar materials readily capable of transporting holes and electrons. Examples of common hosts for singlet emission include polycyclic aromatic compounds such as anthracene derivatives. Examples of common hosts for triplet emission include carbazole compounds and aromatic amines. A wide variety of light-emitting dopants are known and are used to provide the desired emission wavelength by harvesting excitons created from the electron/hole charge injection. Many common singlet emitting dopants are aromatic organic compounds whereas many common triplet emitting dopants are metal complexes of iridium or platinum.

The ETL can be formed of a single or a mixture of organic or inorganic materials and may be divided into several layers. Common ETL materials include metal oxine chelates such as Alq, phenanthroline derivatives such as BCP, triazenes, benzimidazoles, triazoles, oxadiazoles, silane compounds such as silacyclopentadiene derivatives, and borane derivatives. HBL materials (if used) are generally selected from the same group as ETL materials and have hole conduction band significantly lower in energy (more difficult to oxidize) than the underlying LEL thereby creating a barrier to further hole transport.

The EIL may include an ETL material plus a reducing dopant at or near the interface between the cathode and ETL. The reducing dopant can be organic, inorganic, or metal complexes. Common reducing dopants include alkali metals such as Cs or combinations of alkali metals. The EIL may include an alkali or alkaline metal complex, salt or oxide (e.g., lithium quinolate, LiF, CaO) that forms a reducing dopant upon deposition of a cathode material such as aluminum.

OLED Deposition

There are many ways to deposit organic EL medium materials onto a substrate including, but not limited to, solution coating, vapor deposition, and transfer from a donor sheet. In certain embodiments of the present disclosure at least some of the organic OLED layers be deposited by vapor deposition means, e.g., physical vapor deposition in a reduced pressure environment. In some embodiments, most or all of the organic EL medium layers are provided by vapor deposition. Such OLED materials are often referred to as small-molecule OLED materials.

Many types of vapor deposition equipment are suitable. Such equipment may use point sources, linear sources, vapor-injection sources, carrier gas-assisted sources (OVPD) and the like. In some embodiments, the vapor plume is preferably highly directional to achieve a controlled line-of-site deposition through a patterned photoresist structure as will be shown later.

OLED Devices/Backplanes

There is no particular limitation on the type of OLED device that may be fabricated based on methods of the present disclosure, so long as some patterning is intended. The present methods are especially directed to full color OLED displays such as active matrix OLED (AMOLED) and passive matrix OLED (PMOLED), but the methods may be used to prepare OLED lighting and signage. OLED device substrates may be rigid or flexible. Support materials include, but are not limited to, glass, polymers, ceramics and metals, and composites or laminates thereof.

AMOLED backplanes typically include an array of independently addressable first (bottom) electrodes that are connected to thin film transistor (TFT) circuitry provided over a substrate typically in a multilayer structure. The TFT may be based on Si, metal oxide or organic semiconductors (OTFT). In addition to the semiconductors, dielectrics and conductors are used to prepare structures that form the transistors, capacitors, wiring . . . etc. as is known in the art.

Device Patterning

For many organic devices, forming effective interfaces between layers having substantially different functions (heterojunctions) is a critical factor influencing device performance. Some non-limiting examples of such interfaces include junction between a hole-transporting layer and a light-emitting layer, or between an electron transporting layer and a light-emitting layer, or an electron-injecting layer and an electron-transporting layer, or an electron-injecting layer and a cathode, or between an organic semiconductor and a dielectric layer, or between an organic semiconductor and an electrode, or between an electron donor layer and an electron acceptor layer.

Figure 2:
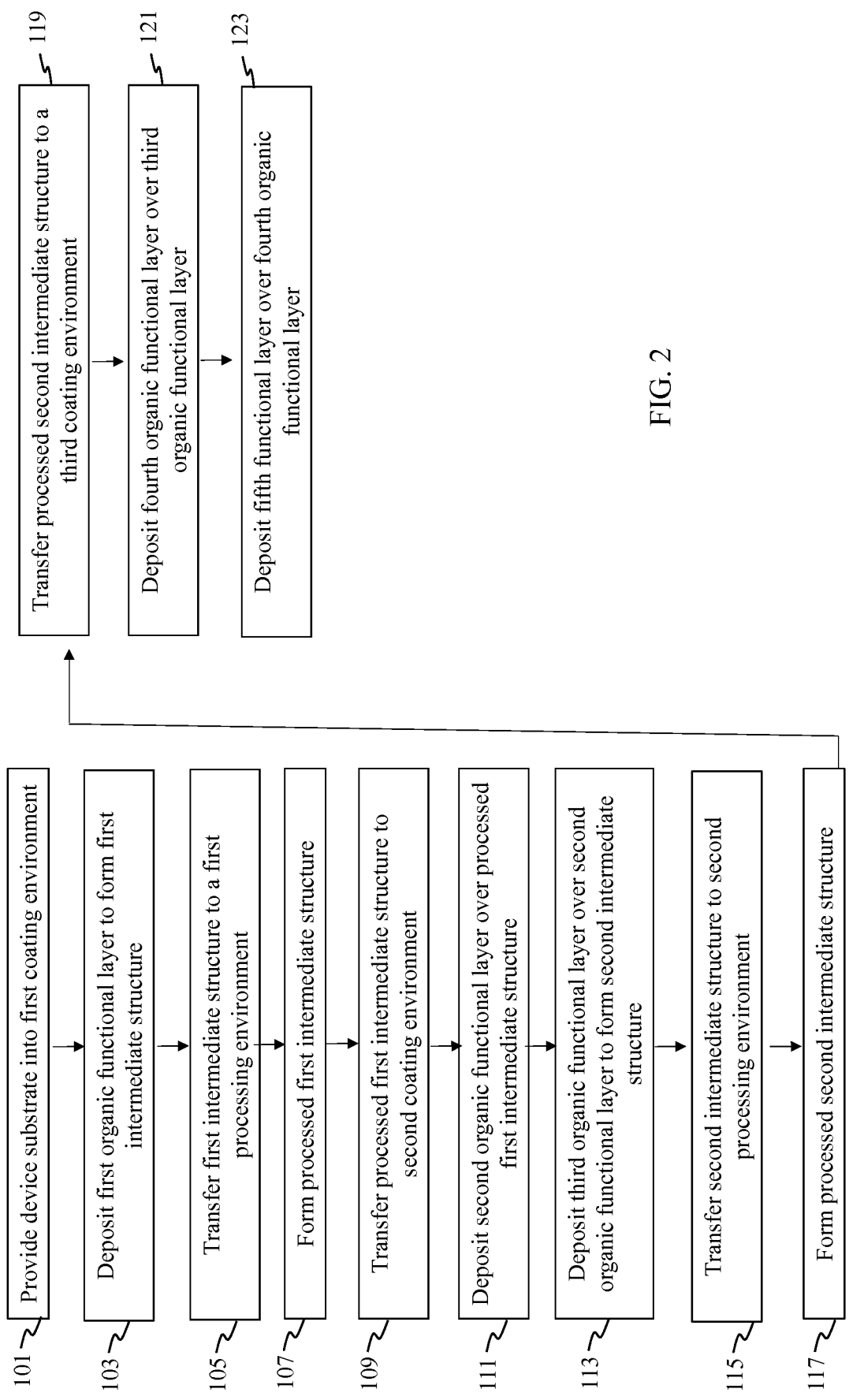
FIG. 2 is a flow chart depicting the steps in an embodiment of the present disclosure.

FIG. 2 shows a flow diagram of an embodiment of a method for improving or preserving effective heterojunction formation. In step 101, a device substrate is provided into a first coating environment that has low levels of potential contaminants such as water vapor and oxygen, e.g., a reduced-pressure environment for vapor deposition of the functional layer or a carefully well-controlled inert gas environment for other coating methods. The structure of the substrate depends upon the desired device. The device substrate may include a support, e.g., materials mentioned above with respect to OLED backplanes. The device substrate may include a multilayer structure having various features, e.g., conductors, circuitry, dielectrics, semiconductors, optical layers and the like. One non-limiting example of such a device includes an OLED device, but the device may instead be an organic photovoltaic, an OTFT, a touch sensor, a chemical sensor, a bioelectronic or medical device, or any device that uses one or more active organic materials.

In step 103, a first organic functional layer, e.g., one that may optionally include an active organic material, is deposited over the substrate to form a first intermediate structure. The first organic functional layer has a first function, e.g., it may have a hole-transporting function or any other function necessary for one of the devices listed above (other charge transport, light-emitting, insulating, optical, conductive, semiconductive, light-sensitive, and the like).

In step 105, the first intermediate structure is transferred to a first processing environment having a contaminant content, e.g., water vapor or oxygen, which is higher than that of the first environment. For example, the coated organic functional layer may be removed to a photolithographic processing environment, and it can be difficult to keep water and oxygen away from the organic functional layers during photoresist coating, developing, lift-off, stripping, patterned radiation exposure, and the like. In the first processing environment, the first intermediate structure is acted upon to form a processed first intermediate structure, step 107. For example, a photolithographic structure such as a lift-off structure may have been formed or removed or both.

The processed first intermediate structure is transferred to a second coating environment in step 109 that has a contaminant content (e.g., water vapor or oxygen) that is lower than that of the first processing environment. Next, in step 111 a second organic functional layer is deposited over the processed first intermediate structure. The second organic functional layer has the same basic function as the first organic functional layer, e.g., they may both be hole-transporting layers. In an embodiment, the first and second organic functional layers have different chemical compositions. In an embodiment, the first and second organic functional layers have different chemical compositions, but share at least one common material. In an embodiment, the first and second organic functional layers have substantially the same chemical composition, although the thickness of the two layers may be different.

In step 113, while in the second coating environment or a similar, low-contaminant coating environment, a third organic functional layer is deposited over the second organic functional layer to form a second intermediate structure. The second organic functional layer is not exposed to an environment having substantially higher contamination (such as a processing environment) prior to deposition of the third organic functional layer. The third organic functional layer has a different function than the first and second organic functional layers. For example, if the first and second organic functional layers have a hole-transporting function, the third organic functional layer may have a light-emitting function or an electron-transporting function. In this manner the key heterojunction between a hole-transporting layer and a light-emitting layer or an electron-transporting layer is formed under low contamination. Where contamination or damage may exist is at the interface between layers having a common function which should have a lower impact on the device performance.

In an embodiment, the method may further include step 115 wherein the second intermediate structure is transferred to a second processing environment. The second processing environment has a higher level of a contaminant such as water vapor or oxygen than the second coating environment. The second processing environment may be the same as or different from the first processing environment. In the second processing environment, the second intermediate structure is acted upon to form a processed second intermediate structure, step 117.

The processed second intermediate structure is transferred to a third coating environment in step 119 that has a contaminant content (e.g., water vapor or oxygen) that is lower than that of the first processing environment. Next, in step 121 a fourth organic functional layer is deposited over the processed second intermediate structure. The fourth organic functional layer has the same basic function as the third organic functional layer, e.g., they may both be electron-transporting layers. In an embodiment, the third and fourth organic functional layers have different chemical compositions. In an embodiment, the third and fourth organic functional layers have different chemical compositions, but share at least one common material. In an embodiment, the third and fourth organic functional layers have substantially the same chemical composition, although the thickness of the two layers may be different.

In step 123, while in the third coating environment or a similar, low-contaminant coating environment, a fifth functional layer is deposited over the second organic functional layer to form a second intermediate structure. The fourth organic functional layer is not exposed to an environment having substantially higher contamination (such as a processing environment) prior to deposition of the fifth functional layer. The fifth functional layer has a different function than the first, second, third and fourth organic functional layers. In an embodiment, the fifth functional layer may be an inorganic layer such as a metal or metal oxide. In an embodiment, the fifth functional layer may be an organic functional layer, e.g., one comprising an active organic material.

An embodiment of using the above method for fabricating an OLED device is shown in cross-sectional view in FIGS. 3A-3H.

Figure 3A:
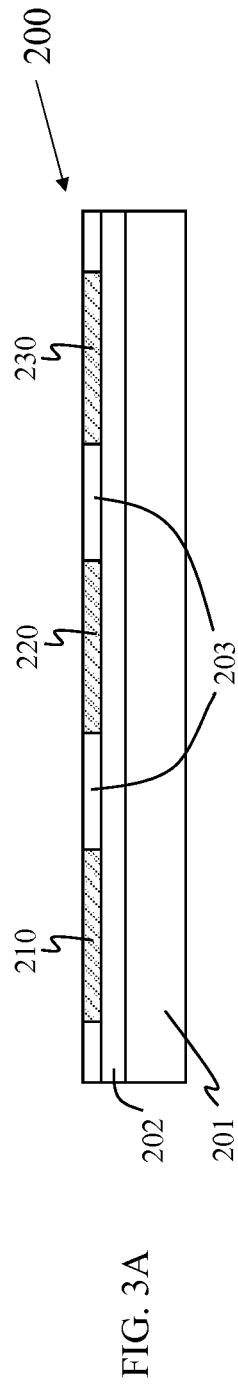
FIG. 3 is a series (3A-3H) of cross-sectional views depicting various stages in the formation of an active matrix OLED device according to an embodiment of the present disclosure.

FIG. 3A shows an embodiment of an OLED substrate 200 or backplane having a support 201 (e.g., flexible or non-flexible glass, plastic or ceramic), a TFT layer portion 202 (which may include multiple layers of wiring, dielectric and semiconductor materials), a first bottom electrode 210, a second bottom electrode 220, a third bottom electrode 230 and an electrode-separating dielectric 203. The first, second and third bottom electrodes each represent one bottom electrode in a first, second and third array of bottom electrodes, respectively, all independently addressable. That is, the first array of bottom electrodes forms a portion of a first array of independently addressable first OLED devices, the second array of bottom electrodes forms a portion of a second array of independently addressable second OLED devices and so on as needed. Although not shown, the electrode-separating dielectric often extends above and slightly over the edges of the bottom electrodes and may serve to help define the functional emissive area of the corresponding OLED device. In the present embodiment, the bottom electrodes act as anodes. In the embodiment described herein, the bottom electrodes are anodes.

Figure 3B:
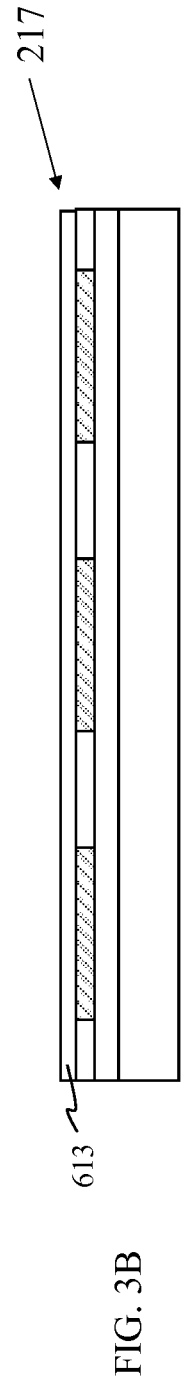

In FIG. 3B, the OLED device substrate is provided into a first coating environment, e.g., a reduced-pressure vapor deposition tool, wherein a common hole-transporting layer (HTL) 613 is deposited over the substrate to form a first intermediate structure 217. In the present embodiment, HTL 613 is a first organic functional layer and there may optionally be other layers provided between the hole-transporting layer and the substrate, e.g., a hole-injecting layer. In FIG.

3C, the first intermediate structure is transferred to a first processing environment wherein a first lift-off structure 211 is provided, e.g., photolithographically, to form a processed first intermediate structure 219. First lift-off structure 211 has an opening 215 corresponding to the first bottom electrode. In the embodiment shown here, the first lift-off structure 211 is a bilayer of first material layer 212 and first patterned photoresist layer 213. An undercut region 214 is formed in layer 212. The first lift-off structure 211 may instead be a single layer or have more than two layers. Lift-off structures are discussed in more detail later.

Figure 3C:
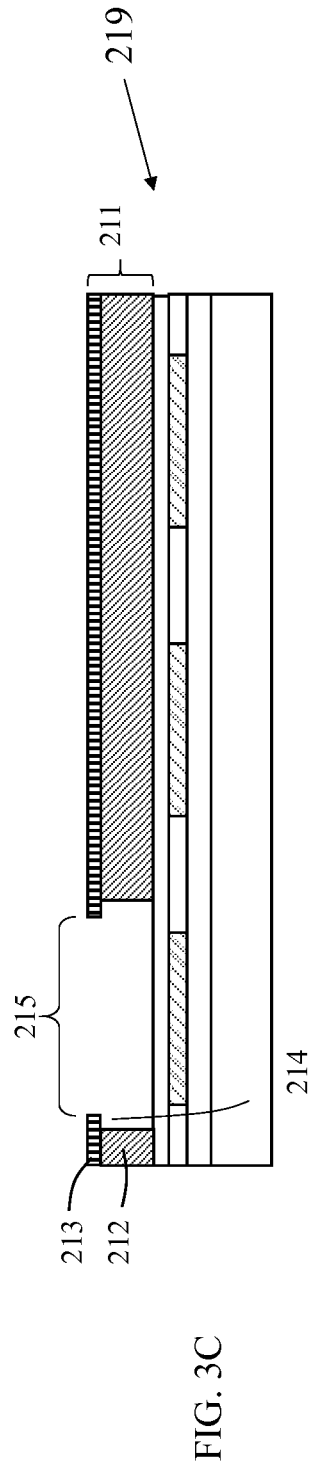
Figure 3D:
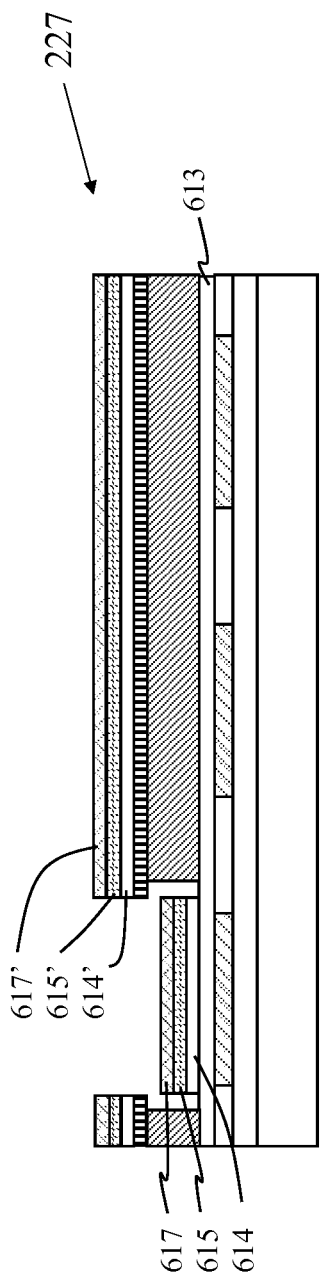

In FIG. 3D, the processed first intermediate structure is transferred to a second coating environment wherein another hole-transporting layer 614 (a second organic functional layer) is deposited followed by deposition of light-emitting layer 615 and electron-transporting layer 617 to form a second intermediate structure 227. In an embodiment, hole-transporting layer 614 comprises the substantially the same material as hole-transporting layer 613. Portions of layers 614, 615' and 617' are deposited over the lift-off structure where portions of layer 614, 615 and 617 are deposited through opening 215 over hole-transporting layer 613 (with hole-transporting layer 614 in contact with 613) and in alignment with the first bottom electrode.

Figure 3E:
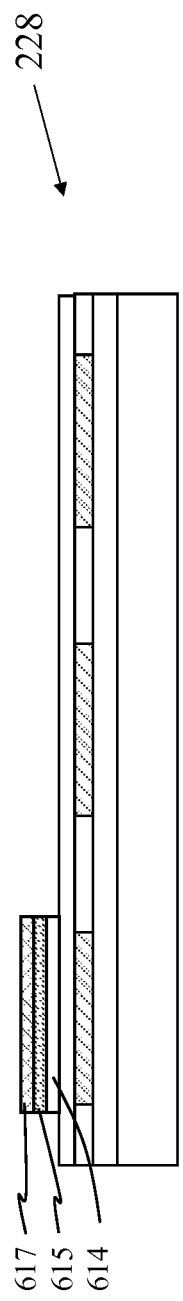
Figure 3F:
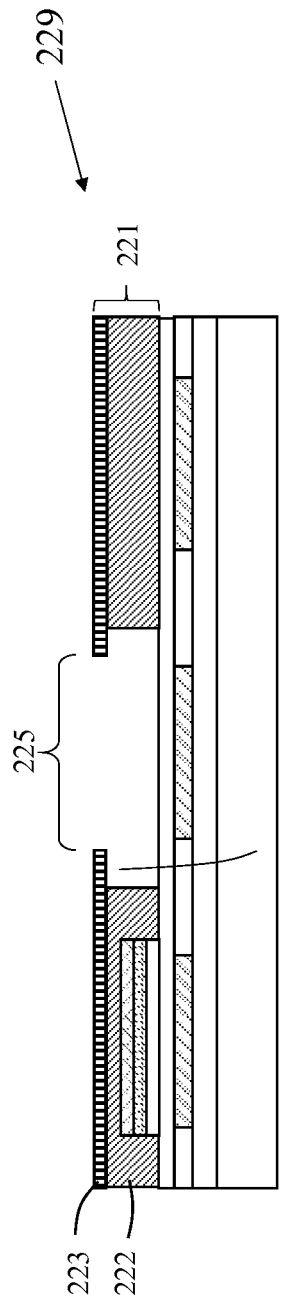

In FIG. 3E, the second intermediate structure is transferred to a second processing environment where the first lift-off structure is removed along with overlying layers 614, 615' and 617' while leaving behind patterned layers 614, 615 and 617 to form a patterned structure 228. In an embodiment, removal is performed by providing a solvent that dissolves the first material layer 212 but that is orthogonal to the patterned photoresist, and layers 613, 614, 615 and 617, thereby causing detachment (lift-off) of the first patterned photoresist 213 and overlying layers. In FIG. 3F, a second lift-off structure is formed over the patterned structure 228 having an opening 225 in alignment with a second bottom electrodes to form a processed second intermediate structure 229. In the embodiment shown here, the second lift-off structure 221 is again a bilayer of second material layer 222 and second patterned photoresist layer 223. An undercut region 224 is formed in layer 222. The second lift-off structure 221 may instead be a single layer or have more than two layers. The materials and methods used to form second lift-off structure 221 may be the same as or different from those used to form the first lift-off structure 211.

Figures 3G, 3H:
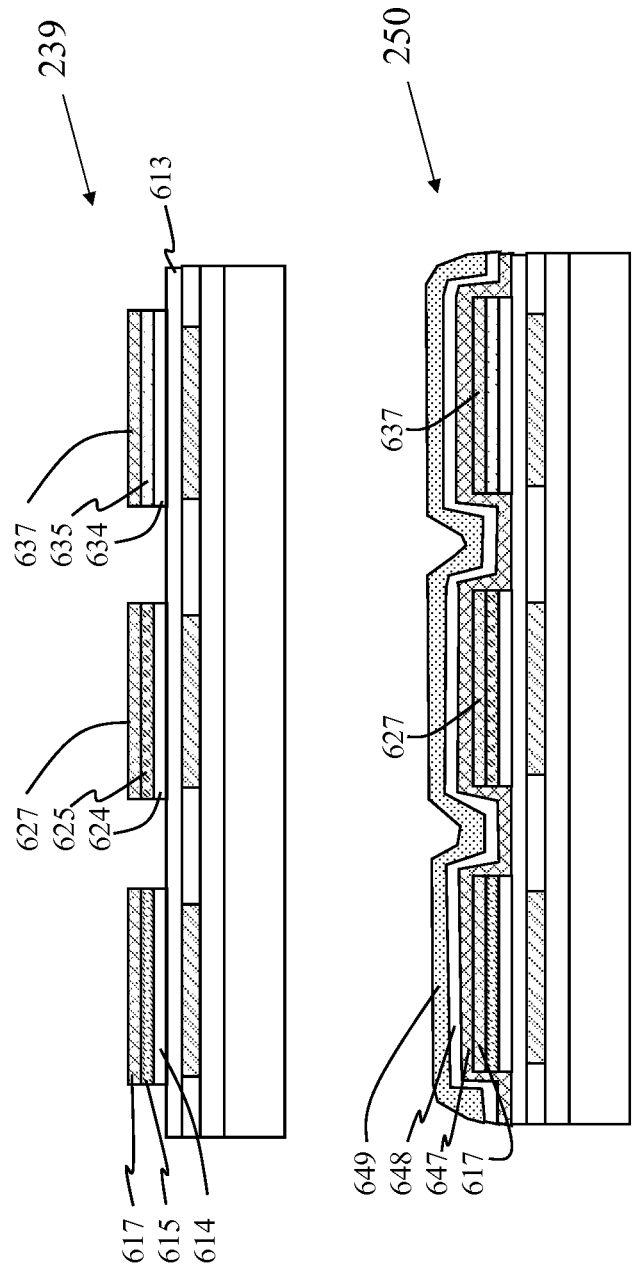

In FIG. 3G, the steps of FIG. 3C through 3E are repeated in a similar manner, but used to provide a processed final intermediate structure 239 having patterned OLED materials in alignment the second and third bottom electrodes. In FIG. 3G, the compositions of hole-transporting layers 624 and 634 may each be the same as or different from 614. In an embodiment, the compositions are substantially same as that of hole-transporting layer 614. Like-wise, the compositions of electron-transporting layers 627 and 637 may each be the same as or different from electron-transporting layer 617. In an embodiment, the compositions are substantially same as that of electron-transporting layer 617. In an embodiment, light-emitting layers 625 and 627 are different in composition from each other and from light-emitting layer 615 so that each emits a different color of light in a functioning device. Although not shown, there may be other intervening layers unique to each organic EL medium "stack". In the present embodiment, the top layer for each stack is an electron-transporting layer.

As shown in FIG. 3H, the processed final intermediate structure is transferred to a final coating environment and in this embodiment, a common electron-transporting layer 647 is provided in contact with electron-transporting layer 617, 627 and 637. A common electron-injecting layer 648 and a common cathode layer 649 is provided over the common electron-transporting layer 647 to form active matrix OLED device 250. In an embodiment, electron-transporting layer 647 is a fourth organic functional layer having the same function as underlying electron-transporting layer 617, which can be considered a third organic functional layer (as can layers 627 and 637). The composition of common electron transporting layer 647 may be the same as or different from any of the electron-transporting layers 617, 627 and 637. In an embodiment, the composition of common electron-transporting layer 647 is substantially the same as the compositions of electron-transporting layers 617, 627 and 637. The common electron-injecting layer 648 or the common cathode layer 649 can be considered a fifth functional layer.

In the above embodiment, any damage that may have occurred to a surface of the first organic functional layer (from water, oxygen, residue from a fluoropolymer, or fluorosolvent treatments) is intra-layer thereby preserving heterojunctions. The need for heterojunction protection may not necessarily involve particular processing environments or coating environments, but rather, may be caused by some action of fluoropolymer processing solvents on the first organic functional layer or by fluoropolymer residue over such layer. Rather than the flow diagram of FIG. 2, the steps may instead include: A) depositing a first organic functional layer over a device substrate to form a first intermediate structure; B) processing the first intermediate structure to form a processed first intermediate structure, wherein the processing includes coating a fluoropolymer over the first intermediate structure and subsequent removal of substantially all of the fluoropolymer with a fluorinated solvent; and C) depositing a second organic functional layer over at least a portion of the first organic functional layer, the first and second organic functional layers having the same function. By substantially all, it may be that a small amount of residual fluoropolymer film is still present. If present, a residual fluoropolymer film should be less than 2 nm, alternatively less than 1 nm, alternatively just one or two monolayers thick. A residual fluoropolymer film may form a continuous or discontinuous film.

In an embodiment, rather than using a photoresist structure for lift-off (a lift-off structure), a photoresist structure may be formed in a processing environment and used as an etch barrier, e.g., a dry etch such as an argon or oxygen plasma or a "wet" etch such as an organic solvent.

Lift-Off Structure

The lift-off structure allows separation of "unwanted" overlying active materials (e.g., OLED materials) in the lift-off patterning process. In an embodiment, at least a portion of the lift-off structure is soluble in a solvent that is orthogonal to the array of OLED devices and the dissolution of this portion enables the separation. In an embodiment, the lift-off structure has a substantially vertical sidewall profile (e.g., 90°±10° relative to the substrate), or preferably, an undercut sidewall profile. The undercut reduces the amount of OLED material that deposits on the sidewalls so that the sidewalls remain unblocked to an appropriate lift-off agent. The thickness of the lift-off structure depends on the particular type of device and intended dimensions, but in general, it is in a range of 0.1 to 10 μm, alternatively in a range of 0.2 to 5 μm, or alternatively in a range of 0.5 to 3 μm.

The lift-off structure should not substantially harm underlying device layers, neither in the lift-off structure's formation nor its subsequent processing. In an embodiment, the lift-off structure includes a layer of a fluorinated material in contact with one or more underlying OLED device layers. In one embodiment, the fluorinated material is photosensitive and can form the lift-off structure by exposure to radiation and development. Such a material may be a positive working (portions exposed to radiation are removed during development) or negative working (portions not exposed to radiation are removed during development). Non-limiting examples of photosensitive fluorinated materials include those disclosed in U.S. patent application Ser. Nos. 12/994,353, 14/113,408, and 14/291,692, the contents of which are incorporated by reference. In an embodiment, the photosensitive fluorinated material is a negative working photopolymer provided from a fluorinated solvent, e.g., a hydrofluoroether. In an embodiment, the photosensitive fluorinated photopolymer is developed in a developing agent comprising one or more fluorinated solvents, e.g., a hydrofluoroether. In an embodiment, a lift-off agent for use with a photosensitive fluorinated photopolymer includes a fluorinated solvent, e.g., a hydrofluoroether.

It can be challenging to achieve necessary photosensitivity, sidewall profile and orthogonality in a single layer lift-off structure. In another embodiment, the lift-off structure includes multiple layers, e.g., as shown in FIG. 3 and as described in U.S. patent application Ser. No. 12/864,407, the contents of which are incorporated by reference. In an embodiment, a material layer comprising a fluorinated material such as a fluorinated molecular solid or fluorinated polymer is provided over a device substrate that may include an active organic material. The fluorinated material may be vapor deposited (e.g., if a molecular solid) or coated from a highly fluorinated solvent including, but not limited to, a hydrofluoroether or a perfluorinated solvent. This layer forms the base of the multilayer lift-off structure and is designed to be chemically inert relative to the underlying device substrate. It does not require photo-active elements such as photoacid generators or reactive groups that may, in some cases, harm the underlying device. The base layer may optionally comprise a light absorbing material to protect the underlying device from potentially high-intensity radiation of the overlying photoresist layer (see below). If so, the light absorbing material is preferably incorporated into the base the layer covalently, e.g., by attaching a light absorbing dye to a fluorinated polymer. The base layer is further designed to be readily soluble in a fluorinated or other orthogonal solvent to enable rapid lift-off as described earlier.

Over the base layer, e.g., a fluorinated material layer, a photoresist layer is applied, e.g., from a coating solvent or by lamination. The photoresist can be a conventional photoresist (positive or negative tone) coated from, or processed with, solvents that would normally be harmful to the underlying device substrate, but the base layer blocks penetration of such harmful materials. When exposed to appropriate radiation, and optionally heat, the photoresist transforms in some way to alter its solubility relative to unexposed photoresist. For example, exposure may activate solubility-altering switching groups, induce cross-linking or cause chain scission. The photoresist may optionally be a fluorinated photoresist provided from a fluorinated coating solvent so long as the underlying base layer retains at least some of its structural integrity. i.e., it is not dissolved too quickly by the coating solvent. Although such fluorinated photoresists may be generally benign, an additional layer of separation from the photoactive layer of photoresist can in some embodiments provide extra protection.

Figure 4:
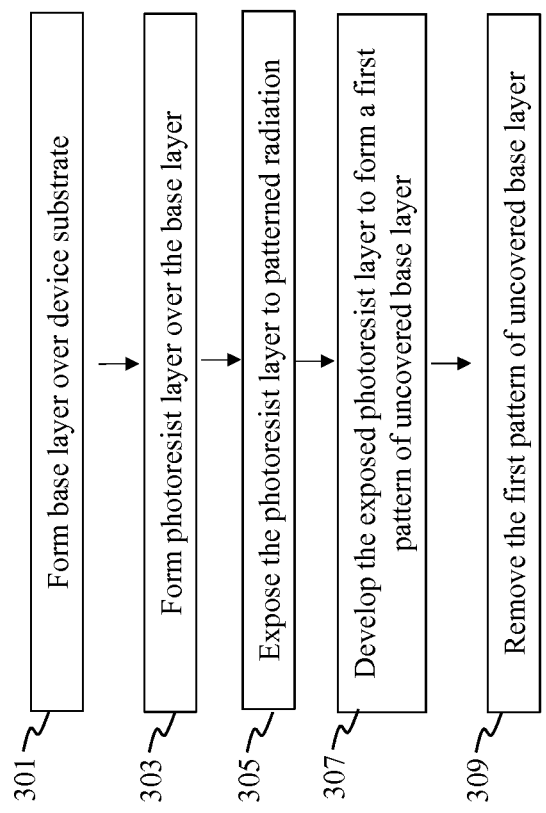
FIG. 4 is a flow chart depicting the steps in an embodiment of the present disclosure.
Figure 5A:
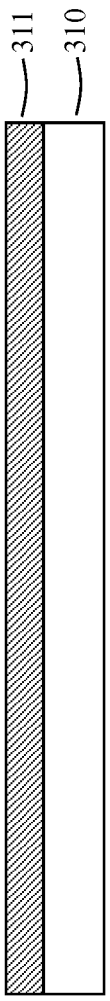
FIG. 5 is a series (5A-5E) of cross-sectional views depicting various stages in the formation of a lift-off structure according to an embodiment of the present disclosure.
Figure 5B:
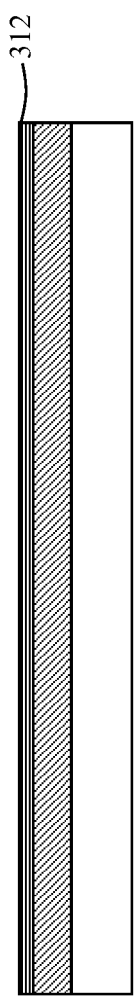
Figure 5C:
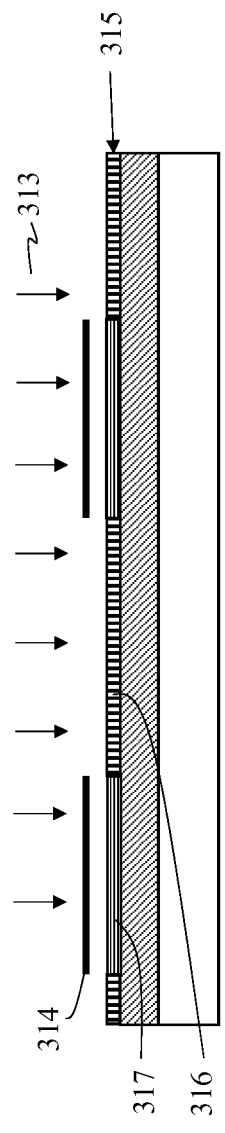
Figure 5D:
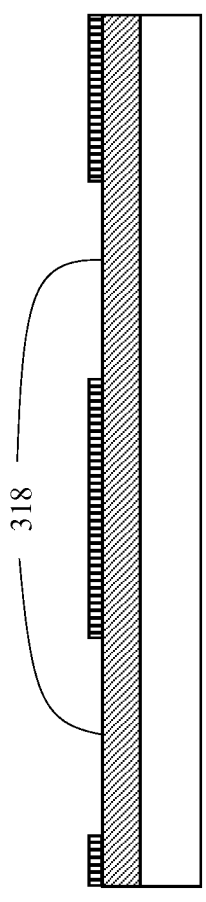
Figure 5E:
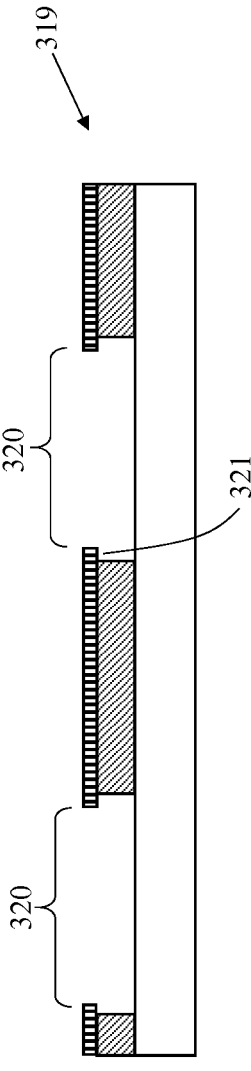

A flow diagram for an embodiment of forming a two-layer lift-off structure is shown in FIG. 4, and in cross-sectional view in FIGS. 5A-5D. Such lift-off structures may be used in the embodiments described in FIG. 3. In step 301, a base layer 311 is formed over device substrate 310. The base layer may undergo subsequent processing steps such as curing, drying, surface treatments or the like. In step 303 a photoresist layer 312 is formed over base layer 311. The photoresist layer may undergo drying or other steps prior to step 305 wherein the photoresist layer 312 is exposed to patterned radiation by providing a radiation source 313 and an intervening photomask 314. This forms an exposed photoresist layer 315 having a pattern of exposed photoresist regions 316 and a complementary pattern of unexposed photoresist regions 317. In this case the photoresist is a negative tone type, but a positive tone could be used instead. Other methods of photopatterning may optionally be used, e.g., projection exposure, patterned laser exposure and the like.

Next, as shown in step 307, the exposed photoresist layer is developed with a developing agent (e.g., an aqueous, alkaline developer if using many conventional photoresists), which in this embodiment, removes unexposed photoresist regions 316 to form a photoresist pattern and a first pattern of uncovered base layer 318. In step 309, the first pattern of uncovered base layer is removed, for example, by using a fluorinated developing agent such as a hydrofluoroether to form lift-off structure 319 having a first pattern of openings 320. In this embodiment, the removal of the base layer forms an undercut region 321. After deposition of functional organic layers, e.g., as described above, the structure is subjected to a lift-off agent that dissolves the base layer. For example, if the base layer is a fluorinated material, the lift-off agent may be a fluorinated solvent, including but not limited to, hydrofluoroethers and perfluorinated solvents.

In many embodiments described above, a fluorinated photoresist or a fluorinated base layer may be coated or processed (e.g., development or lift-off) using a fluorinated solvent. Particularly useful fluorinated solvents include those that are perfluorinated or highly fluorinated liquids at room temperature, which are immiscible with water and many organic solvents. Among those solvents, hydrofluoroethers (HFEs) are well known to be highly environmentally friendly, "green" solvents. HFEs, including segregated HFEs, are preferred solvents because they are non-flammable, have zero ozone-depletion potential, lower global warming potential than PFCs and show very low toxicity to humans.

Examples of readily available HFEs and isomeric mixtures of HFEs include, but are not limited to, an isomeric mixture of methyl nonafluorobutyl ether and methyl nonafluoroisobutyl ether (HFE-7100), an isomeric mixture of ethyl nonafluorobutyl ether and ethyl nonafluoroisobutyl ether (HFE-7200 aka Novec™ 7200), 3-ethoxy-1, 1,1,2,3, 4,4,5,5,6,6,6-dodecafluoro-2-trifluoromethyl-hexane (HFE-7500 aka Novec™ 7500), 1,1,1,2,3,3-hexafluoro-4-(1,1,2,3, 3,3,-hexafluoropropoxy)-pentane (HFE-7600 aka PF7600 (from 3M)), 1-methoxyheptafluoropropane (HFE-7000), 1,1,1,2,2,3,4,5,5,5-decafluoro-3-methoxy-4-trifluoromethylpentane (HFE-7300 aka Novec™ 7300), 1,2-(1,1,2,2-tetrafluoroethoxy)ethane (HFE-578E), 1,1,2,2-tetrafluoroethyl-1H,1H,5H-octafluoropentyl ether (HFE-6512), 1,1,2,2-tetrafluoroethyl-2,2,2-trifluoroethyl ether (HFE-347E), 1,1,2,2-tetrafluoroethyl-2,2,3,3-tetrafluoropropyl ether (HFE-458E), 2,3,3,4, 4-pentafluorotetrahydro-5-methoxy-2, 5-bis[1,2,2,2-tetrafluoro-1-(trifluoromethyl)ethyl]-furan (HFE-7700 aka Novec™ 7700), 1,1,1,2,2,3,3,4,4,5,5,6,6- tridecafluorooctane-propyl ether (TE6O—C3), F(CF$_2$)$_5$OCH$_3$, F(CF$_2$)$_6$OCH$_3$, F(CF$_2$)$_8$OCH$_3$, F(CF$_2$)$_8$OCH$_2$CH$_2$CH$_3$, F(CF$_2$)$_2$O(CF$_2$)$_4$OCH$_2$CH$_3$, F(CF$_2$)$_3$OCF(CF$_3$)CF$_2$OCH$_3$, (CF$_3$)$_2$N(CF$_2$)$_3$OCH$_3$, (C$_3$F$_7$)$_2$N(CF$_2$)$_3$OC$_2$H$_7$,

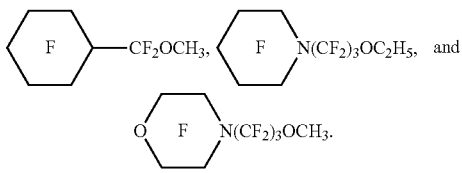

Below are some, non-limiting embodiments of the present disclosure.

1. A method of patterning a multilayer organic device comprising:
   a) providing a device substrate into a first coating environment;
   b) depositing a first organic functional layer over the device substrate to form a first intermediate structure, the first organic functional layer having a first function;
   c) moving the first intermediate structure from the first coating environment to a first processing environment having a water vapor or oxygen content that is higher than that of the first environment;
   d) processing the first intermediate structure with a first processing agent comprising a fluorinated solvent to form a processed first intermediate structure;
   e) moving the processed first intermediate structure from the first processing environment to a second coating environment having a water vapor or oxygen content that is lower than that of the first processing environment:
   f) depositing a second organic functional layer over at least a portion of the first organic functional layer, the second organic functional layer also having the first function; and
   g) depositing a third organic functional layer over the second organic functional layer to form a second intermediate structure, the third organic functional layer having a second function different from the first function.

2. The method of embodiment 1 wherein a first light-emitting layer is provided between the second and third organic functional layers.

3. The method according to embodiment 1 or 2 wherein the first function is a hole-transporting function.

4. The method according to embodiment 3 wherein the first organic functional layer comprises a first hole-transporting material.

5. The method according to embodiment 4 wherein the second organic functional layer comprises the first hole-transporting material.

6. The method according to embodiment 5 wherein the first and second organic functional layers have substantially the same chemical composition.

7. The method according to any of embodiments 1-6 wherein the second function is an electron-transporting function.

8. The method according to embodiment 7 wherein the third organic functional layer comprises a first electron-transporting material.

9. The method according to embodiment 1 or 2 wherein the first function is an electron-transporting function.

10. The method according to embodiment 9 wherein the first organic functional layer comprises a first electron-transporting material.

11. The method according to embodiment 10 wherein the second organic functional layer comprises the first electron-transporting material.

12. The method according to any of embodiments 1, 2 and 11 wherein the first and second organic functional layers have substantially the same chemical composition.

13. The method according to any of embodiments 1, 2, and 9-12 wherein the second function is a hole-transporting function.

14. The method according to embodiment 13 wherein the third organic functional layer comprises a first hole-transporting material.

15. The method according to any of embodiments 1-14 further comprising:
   moving the second intermediate structure from the second coating environment to a second processing environment having a water vapor or oxygen content that is higher than that of the second environment;
   processing the second intermediate structure with a second processing agent comprising a fluorinated solvent to form a processed second intermediate structure;
   moving the processed second intermediate structure from the second processing environment to a third coating environment having a water vapor or oxygen content that is lower than that of the second processing environment;
   depositing a fourth organic functional layer over at least a portion of the third organic functional layer, the fourth organic functional layer having the second function.

16. The method according to embodiment 15 wherein the fourth organic functional layer comprises at least one material that is the same as a material used in the third organic functional layer.

17. The method according to embodiment 16 wherein the third and fourth organic functional layers have substantially the same composition.

18. The method according to any of embodiments 15-17 further comprising depositing a fifth functional layer over the fourth organic functional layer, the fifth functional layer having a third function that is different from the second function.

19. The method according to embodiment 18 wherein the third function is to inject electrons or conduct current.

20. The method according to any of embodiments 1-19 wherein a lift-off structure is formed or removed in at least one processing environment.

21. The method according to any of embodiments 1-20 wherein at least one of the coating environments is a reduced-pressure environment used to vapor deposit one or more organic functional layers.

22. The method according to any of embodiments 1-21 further comprising a heating at least one processed intermediate structure at a temperature in a range of 50° C. to 150° C., optionally under reduced pressure, prior to depositing further functional layers.

23. A method of patterning an organic device comprising:
   a) depositing a first organic functional layer over a device substrate to form a first intermediate structure, the first organic functional layer having a first function;
   b) processing the first intermediate structure to form a processed first intermediate structure, wherein the processing includes coating a fluoropolymer over the first intermediate structure and subsequent dissolution of the fluoropolymer in a first processing agent comprising a fluorinated solvent; and c) depositing a second organic functional layer over at least a portion of the first organic functional layer, the second organic functional layer also having the first function.

24. The method of embodiment 23 further including depositing a third organic functional layer over the second organic functional layer to form a second intermediate structure, the third organic functional layer having a second function different from the first function.

25. The method according to embodiment 23 or 14 wherein the processing includes patterning of the first or second organic functional layer.

26. The method according to any of embodiments 23-25 wherein at least a portion of the processing is conducted in an environment having a water vapor or oxygen content that is higher than the environment used for depositing the first or second organic functional layer.

27. The method according to any of embodiments 23-26 wherein the first function is a hole-transporting function.

28. The method according to any of embodiments 23-26 wherein the first function is an electron-transporting or hole-blocking function.

29. The method according to any of embodiments 23-28 wherein the first and second organic functional layers have substantially the same chemical composition.

30. The method according to any of embodiments 22-29 further including providing a conductive material over the second organic functional layer and over the optional third organic functional layer.

31. The method according to embodiment 30 wherein the conductive material is a cathode or anode in an OLED device.

32. The method according to embodiment 31 further including a light-emitting layer provided between the second and third organic functional layers.

33. The method according to embodiment 31 or 32 wherein the OLED device has improved luminance efficiency relative to an OLED device not having the second organic functional layer.

34. The method according to embodiment 31 or 32 wherein the OLED device has improved lifetime relative to an OLED device not having the second organic functional layer.

35. The method according to any of embodiments 23-34 wherein the organic device includes a fluoropolymer residue between the first and second organic functional layers.

36. The method according to any of embodiments 23-35 wherein a top portion of the first organic functional layer has been modified by oxidation, contact with water vapor or contact with the fluorinated solvent.

37. An organic device comprising: a first organic functional layer having a first function, a second organic functional layer also having the first function and provided over at least a portion of the first organic functional layer and fluorinated polymer disposed between the first and second organic functional layers, the fluorinated polymer forming a continuous or discontinuous film having a thickness of less than 2 nm.

38. The organic device of embodiment 37 wherein the fluorinated polymer is one or two monolayers thick.

39. The organic device of embodiment 37 or 38 wherein the device is an OLED device.

EXAMPLES

Several simple OLED devices were prepared by evaporating 1 nm molybdenum oxide over ITO anode, followed by vapor deposition of 60 nm NPB. At this point the process varied. Sample 1 was kept in a glove box under nitrogen for 1 hour, followed by deposition of 65 nm Alq, 0.5 nm LiF and 100 nm Al to complete this device. Sample 2 was like Sample 1 except it was treated with a hydrofluoroether lift-off solvent prior to the 1 hour hold in the glove box. Sample 3 was like Sample 1 except it was moved to a laboratory ambient environment (air, uncontrolled humidity) for 1 hour rather than holding it in a nitrogen glove box. Sample 4 was like Sample 3 except it was treated with a segregated hydrofluoroether lift-off solvent prior to moving the sample to the laboratory ambient environment. Sample 5 was like Sample 2 except it was coated with a fluoropolymer prior to treatment with the hydrofluoroether in which the fluoropolymer has high solubility. The fluoropolymer was provided from coating a composition including a hydrofluoroether solvent with about 12% by weight of a methacrylate-based fluoropolymer having fluorine-containing pendant alkyl groups and non-fluorine containing pendant alkyl groups. The fluorine content of the fluoropolymer was about 49% by weight. Sample 6 was like Sample 5 except that 10 nm of NPB was vapor deposited prior to deposition of the Alq, Sample 7 was like Sample 4 except it was coated with a fluoropolymer prior to treatment with the hydrofluoroether in which the fluoropolymer has high solubility. Sample 8 was like Sample 7 except that 10 nm of NPB was vapor deposited prior to deposition of the Alq, Table 1 shows luminance efficiency (Lum. Eff.) at 20 mA/cm$^2$ in Cd/A and also time in hours for normalized luminance to degrade to 50% of original ($t_{50}$) when operated at 50 mA/cm$^2$.

| Sample | Fluoropolymer? | HFE treatment? | 1 hour in: | Extra 10 nm NPB? | Lum. Eff. (Cd/A) | $t_{50}$ (hours) |
|---|---|---|---|---|---|---|
| 1 | No | No | Glove Box | No | 3.47 | n/a |
| 2 | No | Yes | Glove Box | No | 3.40 | n/a |
| 3 | No | No | Ambient | No | 3.40 | 41 |
| 4 | No | Yes | Ambient | No | 3.15 | ~80 |
| 5 | Yes | Yes | Glove Box | No | 2.25 | 0.7 |
| 6 | Yes | Yes | Glove Box | Yes | 4.00 | 3.1 |
| 7 | Yes | Yes | Ambient | No | 2.50 | 0.2 |
| 8 | Yes | Yes | Ambient | Yes | 3.29 | 27 |

The above data show a couple of things. Looking at Samples 1-4, both ambient exposure and HFE treatment show a slight decrease in luminance efficiency. A more serious effect is found on luminance efficiency and lifetime when samples have been coated with the fluoropolymer. Although a fluoropolymer coating is not visible after HFE treatment, it is believed that the fluoropolymer leaves behind a small amount of residue in these tests. In tests not reported here, the thickness of the fluoropolymer residue over organic substrates is as low as one or two monolayers. Although selection of cleaning agents (different HFE's, mixtures of HFE and polar solvents) may remove such residue, it is seen above that simply providing a second layer of the HTL material (NPB) largely restores luminance efficiency and significantly improves lifetime. It has subsequently been found that treatment with a non-segregated HFE solvent that has a lower fluorine content by weight than the lift-off HFE solvent, coupled with the extra NPB, fully restores the lifetime ($t_{50}$>80 hours) and luminance efficiency within experimental uncertainty.

LIST OF REFERENCE NUMBERS USED IN THE DRAWINGS

10 OLED Device
11 anode
12 hole-injecting layer (HIL)
13 hole-transporting layer (HTL)
14 electron-blocking layer (EBL)
15 light-emitting layer (LEL)
16 hole-blocking layer (HBL)
17 electron-transporting layer (ETL)
18 electron-injecting layer (EIL)
19 cathode
20 organic EL medium
101 provide device substrate into first coating environment step
103 deposit first organic functional layer to form first intermediate structure step
105 transfer first intermediate structure to first processing environment step
107 form processed first intermediate structure step
109 transfer processed first intermediate structure step
111 deposit second organic functional layer step
113 deposit third organic functional layer to form second intermediate structure step
115 transfer second intermediate structure step
117 form processed second intermediate structure step
119 transfer processed second intermediate structure step
121 deposit fourth organic functional layer step
123 deposit fifth functional layer step
200 OLED substrate
201 support
202 TFT layer portion
203 electrode-separating dielectric
210 first bottom electrode
211 first lift-off structure
212 first material layer
213 first patterned photoresist layer
214 undercut region
215 opening
217 first intermediate structure
219 processed first intermediate structure
220 second bottom electrode
221 second lift-off structure
222 second material layer
223 second patterned photoresist layer
224 undercut region
225 opening
227 second intermediate structure
228 patterned structure
229 processed second intermediate layer
230 third bottom electrode
239 processed final intermediate structure
250 active matrix OLED device
301 form base layer step
303 form photoresist layer step
305 expose the photoresist layer step
307 develop the exposed photoresist layer step
309 remove first pattern of uncovered base layer step
310 device substrate
311 base layer
312 photoresist layer
313 radiation source
314 photomask
315 exposed photoresist layer
316 pattern of exposed photoresist regions
317 pattern of unexposed photoresist regions
318 first pattern of uncovered base layer
319 lift-off structure
320 first pattern of openings
321 undercut regions
613 common hole-transporting layer
614 hole-transporting layer
615 light-emitting layer
617 electron-transporting layer
624 hole-transporting layer
625 light-emitting layer
627 electron-transporting layer
634 hole-transporting layer
635 light-emitting layer
637 electron-transporting layer
647 common electron-transporting layer
648 common electron-injecting layer
649 common cathode

The invention claimed is:

1. An OLED device comprising:
a hole-injecting layer;
an electron-injecting layer;
a first organic functional layer having a first function;
a second organic functional layer also having the first function and provided over at least a portion of the first organic functional layer; and
a fluorinated polymer disposed between the first and second organic functional layers, the fluorinated polymer forming a continuous or discontinuous film having a thickness of less than 2 nm,
wherein the first and second organic functional layers are disposed between the hole-injecting layer and the electron-injecting layer.

2. The OLED device of claim 1 wherein the fluorinated polymer is one or two monolayers thick.

3. The OLED device of claim 1 wherein the first function is a hole transport function.

4. The OLED device of claim 1 wherein the first and second organic functional layers are small-molecule materials.

5. The OLED device of claim 1 wherein the first and second organic functional layers have different chemical compositions.

6. The OLED device of claim 1 wherein the first and second organic functional layers comprise at least one common material.

7. The OLED device of claim 1 wherein the first and second organic functional layers have the same chemical composition.

8. The OLED device of claim 7 wherein the first and second organic functional layers have different thicknesses.

9. The OLED device of claim 1 wherein the first function is an electron transport function.

10. The OLED device of claim 1 wherein the first function is a hole-blocking function.

* * * * *